(12) United States Patent
Wong

(10) Patent No.: US 6,826,084 B1
(45) Date of Patent: Nov. 30, 2004

(54) ACCESSING INDIVIDUAL STORAGE NODES IN A BI-DIRECTIONAL NONVOLATILE MEMORY CELL

(75) Inventor: Sau Ching Wong, Hillsborough, CA (US)

(73) Assignee: Multi Level Memory Technology, Reno, NV (US)

( * ) Notice: Subject to any disclaimer, the term of this patent is extended or adjusted under 35 U.S.C. 154(b) by 0 days.

(21) Appl. No.: 10/831,675

(22) Filed: Apr. 23, 2004

Related U.S. Application Data

(62) Division of application No. 10/140,527, filed on May 6, 2002, now Pat. No. 6,747,896.

(51) Int. Cl.[7] .............................................. G11C 16/04
(52) U.S. Cl. ............................ 365/185.18; 365/185.24; 365/185.27
(58) Field of Search ...................... 365/185.18, 189.08, 365/189.04, 185.24, 185.27, 185.03

(56) References Cited

U.S. PATENT DOCUMENTS

| | | | |
|---|---|---|---|
| 3,895,360 A | 7/1975 | Cricchi et al. | |
| 4,016,588 A | 4/1977 | Ohya et al. | |
| 4,173,766 A | 11/1979 | Hayes | |
| 4,173,791 A | 11/1979 | Bell | |
| 4,281,397 A | 7/1981 | Neal et al. | |
| 4,360,900 A | 11/1982 | Bate | |
| 4,380,057 A | 4/1983 | Kotecha et al. | |
| 4,527,257 A | 7/1985 | Cricchi | |
| 4,586,163 A | 4/1986 | Koike | |
| 4,630,085 A | 12/1986 | Koyama | |
| 4,667,217 A | 5/1987 | Janning | |
| 4,742,491 A | 5/1988 | Liang et al. | |
| 4,847,808 A | 7/1989 | Kobatake | |
| 4,870,470 A | 9/1989 | Bass, Jr. et al. | |
| 5,021,999 A | 6/1991 | Kohda et al. | |

(List continued on next page.)

Primary Examiner—Michael S. Lebentritt
Assistant Examiner—Hien Nguyen
(74) Attorney, Agent, or Firm—David T. Millers

(57) ABSTRACT

A memory transistor has a pair of separate floating gates overlying end regions of a channel and a control gate that overlies the floating gates and a central region of the channel. The memory transistor effectively operates as a pair of floating gate transistors with an intervening select transistor. Each floating gate can be charged to store a distinct binary, analog, or multi-bit value. The direction of the channel current controls which floating gate receives channel hot electron injection during programming and which floating gate state is sensed during reading. A read operation biases the word line higher that the threshold voltage used to store data and compares the resulting channel to reference currents to identify a stored binary, analog, or multi-bit value. The threshold voltage range can include negative threshold voltages, which increases the available range for multi-bit-per-floating gate storage. The memory transistors can be integrated into a contactless array architecture having approximately one global bit/virtual ground line for every four floating gates along a row.

10 Claims, 9 Drawing Sheets

U.S. PATENT DOCUMENTS

| | | |
|---|---|---|
| 5,159,570 A | 10/1992 | Mitchell et al. |
| 5,172,338 A | 12/1992 | Mehrotra et al. |
| 5,204,835 A | 4/1993 | Eitan |
| 5,214,303 A | 5/1993 | Aoki |
| 5,267,194 A | 11/1993 | Jang |
| 5,268,861 A | 12/1993 | Hotta |
| 5,293,563 A | 3/1994 | Ohta |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,345,425 A | 9/1994 | Shikatani |
| 5,349,221 A | 9/1994 | Shimoji |
| 5,359,554 A | 10/1994 | Odake et al. |
| 5,364,806 A | 11/1994 | Ma et al. |
| 5,412,601 A | 5/1995 | Sawada et al. |
| 5,414,693 A | 5/1995 | Ma et al. |
| 5,418,743 A | 5/1995 | Tomioka et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari |
| 5,477,499 A | 12/1995 | Van Buskirk et al. |
| 5,495,440 A | 2/1996 | Asakura |
| 5,518,942 A | 5/1996 | Shrivastava |
| 5,521,870 A | 5/1996 | Ishikawa |
| 5,583,808 A | 12/1996 | Brahmbhatt |
| 5,623,438 A | 4/1997 | Guritz et al. |
| 5,661,053 A | 8/1997 | Yuan |
| 5,714,412 A | 2/1998 | Liang et al. |
| 5,717,636 A | 2/1998 | Dallabora et al. |
| 5,753,950 A | 5/1998 | Kojima |
| 5,760,435 A | 6/1998 | Pan |
| 5,768,192 A | 6/1998 | Eitan |
| 5,777,919 A | 7/1998 | Chi-Yung et al. |
| 5,793,666 A | 8/1998 | Yamazaki |
| 5,812,449 A | 9/1998 | Song |
| 5,821,581 A | 10/1998 | Kaya et al. |
| 5,825,686 A | 10/1998 | Schmitt-Landsiedel et al. |
| 5,841,693 A | 11/1998 | Tsukiji |
| 5,844,839 A | 12/1998 | Smayling et al. |
| 5,862,076 A | 1/1999 | Eitan |
| 5,875,128 A | 2/1999 | Ishizuka |
| 5,936,887 A | 8/1999 | Choi et al. |
| 5,949,711 A | 9/1999 | Kazerounian |
| 5,963,465 A | 10/1999 | Eitan |
| 5,966,603 A | 10/1999 | Eitan |
| 6,009,013 A | 12/1999 | Van Houdt et al. |
| 6,011,725 A | 1/2000 | Eitan |
| 6,030,871 A | 2/2000 | Eitan |
| 6,037,226 A | 3/2000 | Ra |
| 6,133,098 A | 10/2000 | Ogura et al. |
| 6,134,156 A | 10/2000 | Eitan |
| 6,151,248 A | 11/2000 | Harari et al. |
| 6,169,307 B1 | 1/2001 | Takahashi et al. |
| 6,201,282 B1 | 3/2001 | Eitan |
| 6,215,148 B1 | 4/2001 | Eitan |
| 6,243,289 B1 | 6/2001 | Gonzalez et al. |
| 6,248,633 B1 | 6/2001 | Ogura et al. |
| 6,249,454 B1 | 6/2001 | Sung et al. |
| 6,256,231 B1 | 7/2001 | Lavi et al. |
| 6,261,904 B1 | 7/2001 | Pham et al. |
| 6,266,278 B1 | 7/2001 | Harari et al. |
| 6,285,574 B1 | 9/2001 | Eitan |
| 6,317,363 B1 | 11/2001 | Guterman et al. |
| 6,344,997 B2 | 2/2002 | Sung et al. |
| 6,385,089 B2 | 5/2002 | Sung et al. |
| 6,480,422 B1 | 11/2002 | Wong |
| 6,570,810 B2 | 5/2003 | Wong |
| 2002/0105036 A1 * | 8/2002 | Wang et al. ............... 257/390 |

* cited by examiner

ACCESSING INDIVIDUAL STORAGE NODES IN A BI-DIRECTIONAL NONVOLATILE MEMORY CELL

CROSS-REFERENCE TO RELATED APPLICATIONS

This patent document is a divisional and claims benefit of the earlier filing date of U.S. patent application Ser. No. 10/140,527, filed May 6, 2002, now U.S. Pat. No. 6,747,896 which is hereby incorporated by reference in its entirety.

BACKGROUND

One of the primary goals of memory manufacturers is increasing the storage density of memory devices. Improvements in integrated circuit fabrication techniques can achieve this goal by reducing the sizes of integrated circuit structures. Accordingly, as fabrication techniques improve, manufacturers can often increase memory densities simply by making the same memory structures smaller. Another technique for improving storage density is improving the functionality of memory structures to provide more storage per area. This can be achieved, for example, by creating memory cells and peripheral memory circuits that are capable of storing more information per memory cell.

U.S. Pat. No. 6,011,725, entitled "Two Bit Non-Volatile Electrically Erasable and Programmable Semiconductor Memory Cell Utilizing Asymmetrical Charge Trapping" describes a non-volatile memory that stores two bits per memory cell. FIG. 1 shows a memory cell 100 such as described in U.S. Pat. No. 6,011,725. Memory cell 100 includes diffused N+ source/drain regions 120A and 120B in a silicon substrate 110, a gate insulator 130 overlying substrate 110, and a gate 150 overlying gate insulator 130. Gate insulator 130 has an ONO structure including a silicon nitride region 140 sandwiched between silicon dioxide regions 132 and 134.

Two bits of data are stored in memory cell 100 as charge that is trapped in separated and isolated locations 140A and 140B in nitride region 140. Each location 140A or 140B corresponds to a bit having a value 0 or 1 according to the state of trapped charge at the location 140A or 140B. To program cell 100, gate 150 is raised to a high voltage while a channel current passes between diffused regions 120A and 120B and injects charge into nitride region 140. The location 140A or 140B of the injected charge depends on the characteristics of memory cell 100, the applied voltages, and whether the channel current flows from region 120A to region 120B or from region 120B to region 120A. The direction of the channel current during a programming operation thus selects which of the bits (i.e., location 140A or 140B) is programmed.

Reading a data bit from a particular location 140A or 140B is accomplished by biasing gate 150 at a voltage that is above the threshold voltage of memory cell 100 when locations 140A and 140B are in an unprogrammed state. The diffused region 120A or 120B that is closest to the location 140A or 140B being read is biased as the source/region for the read operation. Any charge trapped in locations 140A and 140B affects a portion of the underlying channel so that negative charge trapped near the source effectively reduces the gate-to-source voltage and correspondingly reduces the channel current during the read operation. In contrast, negative charge near the drain region is ineffective at reducing the channel current since an appropriate drain voltage effectively punches through the portion of the channel near the drain. Sensing whether a channel current flows in memory cell 100 during the read indicates the value of the bit associated with the location 140A or 140B nearest the source/region 120A or 120B.

Memory cell 100 has the advantage of providing non-volatile storage of two bits of information in a single-transistor memory cell, increasing the storage density when compared to a memory device storing one bit of data per storage transistor. However, scaling memory cell 100 down to smaller feature sizes may present difficulties. In particular, operation of memory cell 100 requires the ability to inject charge into separate locations 140A and 140B in nitride region 140. As the size of nitride region 140 decreases, the shorter distance between locations 140A and 140B may be unable to accommodate lateral charge movement after the write operation. Additionally, the amount of charge trapped at locations 140A and 140B of nitride region 140 is relatively small (e.g., typically a few hundred electrons) when compared, for example, to the charge (e.g., typically tens of thousands of electrons) in the floating gate of a conventional Flash memory cell. The smaller trapped charge makes precise control of threshold voltages more difficult because small variations in the trapped charge have large effects. This renders analog or multi-bit storage at each location 140A or 140B in memory cell 100 substantially more difficult than analog or multi-bit storage in a conventional Flash memory cell.

SUMMARY

In accordance with an aspect of the invention, a memory transistor has two laterally separated floating gates over a channel. A control gate that overlies the floating gates extends into a gap between the floating gates to directly modulate a central channel portion between the floating gates. The memory transistor can store separate data values as charge on the separate floating gates. The threshold voltage of the memory transistor depends on the charge stored on the floating gates and the direction of the channel current. Since the amount of charge that can be stored on each floating gate is relatively large compared to charge that can be trapped in a gate insulator, the amounts of stored charge and the threshold voltages of the dual-floating-gate memory transistor can be controlled more precisely than is possible in some known memory devices that store data as locally trapped charge. The control gate directly modulating the central channel region shuts off the current through unselected memory transistors, which permits "over-erasing" the floating gates to extend the usable threshold voltage range for storing data. The improved control of the threshold voltage and the larger available threshold voltage range facilitates reliable storage of multiple levels or multiple bits of data in each floating gate.

In accordance with a further aspect of the invention, the memory transistor having laterally separated floating gates uses holes in the floating gates to define the charge states representing data values. Charge states arising from holes on a floating gate are known to provide better data stability. The holes cause channel regions under the floating gate to have low or negative threshold voltages, while the central channel region, which the control gate modules, has a positive threshold voltage. Accordingly, the memory transistor is off when the control gate is grounded, but a read operation that biases the control gate to a level sufficient for charge inversion in the central channel region can compare the amount of current through a memory transistor to a reference current to determine a stored data value.

One specific embodiment of the invention is a device containing an array of memory transistors. Each memory transistor includes: a first source/drain region, a second source/drain region, and a channel in a substrate; a first floating gate overlying a first end of the channel adjacent the first source/drain region; a second floating gate overlying a second end of the channel adjacent the second source/drain region; and a control gate overlying the first and second floating gates and extending into the gap between the first and second floating gates. The first and second source/drain regions can extend under part of the first and second floating gates, respectively, to reduce the effective channel lengths under the first and second floating gates and improve the selectivity and precision of writing and reading stored data values associated with the floating gates.

In contactless, virtual ground architecture, the array includes multiple banks. Each bank includes diffused lines in the substrate, and each column of the memory transistors in the bank corresponds to and connects to an adjacent pair of the diffused lines. A first of the corresponding diffused lines electrically connects the first source/drain regions of the memory transistor in the row, and a second of the corresponding diffused lines electrically connects the second source/drain regions of the memory transistor in the row. Word lines overlie and connect to or form the control gates for the memory transistors in corresponding rows of the array.

Metal column lines overlie the banks and connect to the diffused lines through bank select devices. In particular, first bank select cells connect to respective column lines, and each first bank select cell is between the connected column line and a corresponding adjacent pair of the diffused lines. Second bank select cells also connect to the column lines with each second bank select cell being between the connected column line and a corresponding adjacent pair of the diffused lines. The first and second bank select cells connect to opposite ends of the diffused lines in the bank, and the adjacent pairs of diffused lines corresponding to the second bank select cells are offset relative to the adjacent pairs of diffused lines corresponding to the first bank select cells. With this configuration, the numbers of the column lines, the diffused lines, and the floating gates are in respective proportions N, 2N−1, and 4(N−1). The metal column lines, which connect to peripheral circuits, have a pitch that is wide compared to the pitch of metal lines in a conventional contactless Flash memory. The wider pitch provides additional area for layout of pitch-sensitive array supporting circuits and reduces capacitive coupling between metal column lines.

Another embodiment of the invention is an erase operation for a memory transistor having the above-described structure. The erase operation includes biasing the control gate and a well containing the memory transistor at respective negative and positive voltages that are sufficient to induce charge tunneling between the well and the first and second floating gates. The biasing of the control gate and the well is maintained to remove any excess electrons from the first and second floating gates and can be continued to over-erase the first and second floating gates. As a result, the first and second floating gates can have an excess of holes that gives the underlying channel regions negative threshold voltages and/or operation in depletion mode. The lower threshold voltage of the erased states for the memory transistors provides a wider threshold voltage range for analog or multi-bit data storage. High threshold voltages are not needed for data storage, which improves data retention, reduces cell disturb, and may avoid the need for word line boost circuits that can slow the biasing of word lines during random-access read operations.

Another embodiment of the invention is a write operation for a memory transistor such as described above. The write operation includes biasing the control gate, the first source/drain region, and the second source/drain region at a first programming voltage, ground, and a second programming voltage, respectively. The first and second programming voltages respectively on the control gate and the second source/drain region induce channel hot electron injection that injects electrons into the second floating gate without changing the charge on the first floating gate. The write operation can further include biasing the control gate, the first source/drain region, and the second source/drain region at the first programming voltage, the second programming voltage, and ground. The first and second programming voltages respectively on the control gate and the first source/drain region induce channel hot electron injection that injects electrons into the first floating gate without changing the charge on the second floating gate. The write operation can store a binary, analog, or multi-bit value on a floating gate by stopping the write operation when the floating gate reaches a charge state representing the value to be stored.

A series of verify operations can test whether a write operation has reached a target state corresponding to the value being stored. One verify operation biases the control gate at a first read voltage, grounds the second source/drain region, biases the first source/drain region at a second read voltage; and compares current through the memory transistor to a reference current associated with the multi-bit value. The first read voltage, which is applied to the control gate, is typically higher than the upper boundary of the threshold voltage range used to store data, which causes the memory transistor to be conductive regardless of the charge states of the floating gates. The write operation ends in response to the comparison indicating that the current through the memory transistor corresponds to a level associated with the value being written. An alternative verify operation can bias the control gate at the target threshold voltage for the memory transistor and then sense whether the memory transistor conducts.

Yet another embodiment of the invention is a read operation for a memory transistor having the structure described above. To read a data value associated with the first floating gate, the read operation includes: biasing the control gate at a first read voltage (typically higher than the highest threshold voltage used for data storage); grounding the first source/drain region; biasing the second source/drain region at a second read voltage; comparing a channel current of the memory transistor to one or more reference currents associated with stored values; and using results of the comparisons to determine a first stored value, which is associated with the first floating gate. To read a data value associated with the second floating gate, the read operation includes: biasing the control gate at the first voltage; grounding the second source/drain region; biasing the first source/drain region at the second voltage; comparing the channel current of the memory transistor to the one or more reference currents; and using results of these comparisons to determine a second stored value, which is associated with the second floating gate. The one or more reference currents can be a single reference current for storage of one bit or analog value per floating gate or multiple reference currents respectively corresponding to multi-bit stored values.

Yet another embodiment of the invention is a method for manufacturing a memory device. The method includes: forming a first source/drain region, a second source/drain region, and a channel in a substrate, wherein the channel extends from the first source/drain region to the second source/drain region; forming a first floating gate overlying and insulated from a first portion of the channel adjacent the first source/drain region; forming a second floating gate overlying and insulated from a second portion of the channel adjacent the second source/drain region, wherein a gap between the second floating gate and the first floating gate overlies a central portion of the channel between the first and second portions of the channel; and forming a control gate overlying and insulated from the first and second floating gates, the control gate extending into the gap between the first and second floating gates and modulating the central portion of the channel.

The first and second source/drain regions can be formed before the first and second floating gates so that the first and second source/drain regions underlie significant portions of the first and second floating gates. Alternatively, the first and second source/drain regions can be formed by implanting impurities into the substrate using the first and second floating gates to at least partially define boundaries of implanted areas and then oxidizing the implanted regions at high temperature to cause the implanted regions to diffuse laterally under the first and second floating gates and to form oxide regions over the first and second source/drain regions. The first and second floating gates can also control implantation steps that adjust a threshold voltage of the central region relative to threshold voltages of the first and second portions of the channel.

BRIEF DESCRIPTION OF THE DRAWINGS

Use of the same reference symbols in different figures indicates similar or identical items.

DETAILED DESCRIPTION

In accordance with an aspect of the invention, a memory transistor for non-volatile storage of multiple data bits has two floating gates laterally separated over a common channel. The memory transistor is bi-directional in that the threshold voltage of the memory transistor depends on the direction of the current through the channel and the charge state of the particular floating gate nearest the region acting as the source of channel current. To store data in a selected one of the two floating gates, a programming operation drives the channel current in a direction that injects charge into the selected floating gate. A read operation selects a direction for the channel current according to which of the two floating gates is being read.

In accordance with another aspect of the invention, extending the source/drain regions under the floating gates reduces the effective size of the floating gates and the effective channel length that the floating gates influence. The source/drain regions can be formed under the floating gates by forming the source/drain regions before forming the floating gates, implanting the source/drain regions through portions of the floating gates followed by a short high-temperature oxidation cycle, or heating the structure so that impurities from implanted regions diffuse laterally under the floating gates. The two floating gates thus overlie and affect small portions of the channel of the memory transistor. Mini-field oxide regions grown over the source/drain regions can separate portions of the floating gates from the source/drain regions to reduce capacitve couplings between the source/drain regions and the overlying floating gates and between the source/drain regions and the overlying control gate.

Figure 2A:
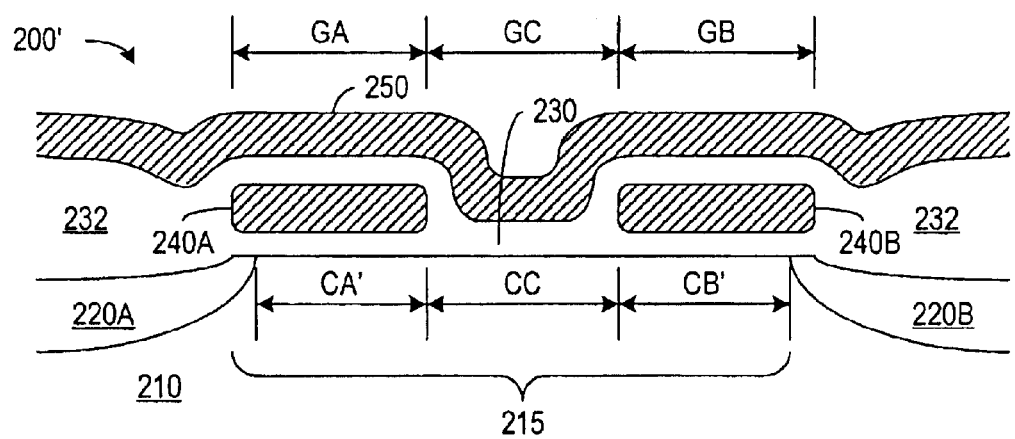
FIGS. 2A and 2B are cross-sectional views of memory transistors in accordance with alternative embodiments of the invention.

FIG. 2A shows a cross-sectional view of a memory transistor 200' in accordance with an embodiment of the invention. Memory transistor 200' has source/drain regions 220A and 220B formed in a semiconductor substrate 210. In an exemplary embodiment, substrate 210 is P+ silicon, source/drain regions 220A and 220B are N+ regions, and a channel 215 extends between N+ regions 220A and 220B. Floating gates 240A and 240B overlie end regions CA' and CB' of channel 215, and a control gate 250 overlies floating gates 240A and 240B and a central region CC of channel 215. A thin gate insulator 230, which can be a conventional gate oxide or tunnel oxide, separates channel 215 from floating gate 240A, control gate 250, and floating gate 240B, so that the voltages on floating gate 240A, floating gate 240B, and control gate 250 modulate or otherwise control the current in respective channel regions CA', CB', and CC. The gate oxide between control gate 250 and channel region CC is typically thicker than the tunnel oxide under floating gates 240A and 240B. Mini-field oxide regions 232 are between control gate 250 and source/drain regions 220A and 220B, and an insulator surrounding floating gates 240A and 240B electrically isolates floating gate 240A and 240B from each other and from control gate 250. The insulator between control gate 250 and floating gates 240A and 240B can be an ONO layer, which is typical for floating gate memory devices.

A photolithographic patterning and chemical etching process can define widths GA and GB of floating gates 240A and 240B and a separation GC between floating gates 240A and 240B, making widths GA and GB and separation GC at least as large as the minimum feature size of patterning process. In memory transistor 200', edges of source/drain regions 220A and 220B are self-aligned with edges of floating gates 240A and 240B, so that channel regions CA' and CB' have lengths about equal to the respective widths GA and GB of the overlying floating gates 240A and 240B.

Matching performance of both bits in memory transistor 200' generally requires that the widths GA and GB of floating gates 240A and 240B be equal and the lengths of channel regions CA' and CB' be equal. The geometry of memory transistor can however be widely varied from the geometry of the illustrated embodiment. For example, separation GC between floating gates 240A and 240B can be larger or smaller than the floating gate width GA or GB to make the length of channel region CC larger or smaller.

Figure 2B:
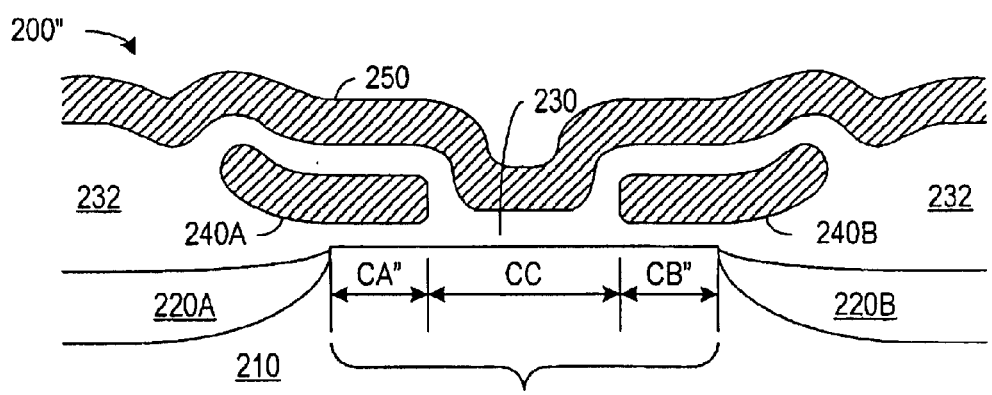

FIG. 2B shows a cross-sectional view of a memory transistor 200" in accordance with another embodiment of the invention. Memory transistor 200" includes source/drain regions 220A and 220B in semiconductor substrate 210, floating gates 240A and 240B overlying end channel regions CA" and CB", and control gate 250 overlying floating gates 240A and 240B and central channel region CC. Memory transistor 200" of FIG. 2B differs from memory transistor 200' of FIG. 2A primarily in that source/drain regions 220A and 220B underlie significant proportions of floating gates 240A and 240B. This overlap may be created by forming source/drain regions 220A and 220B before forming floating gates 240A and 240B, implanting source/drain regions 220A and 220B through floating gates 240A and 240B, or heating substrate 210 (e.g., during subsequent high-temperature processing steps) to make impurities from doped regions diffuse laterally under floating gates 240A and 240B.

In memory transistor 200", mini-field oxide regions 232 between control gate 250 and source/drain regions 220A and 220B reduce the undesirable capacitive coupling between floating gates 240A and 240B and respective underlying source/drain regions 220A and 220B.

In memory transistor 200", the voltages on floating gates 240A and 240B control conductivity through end channel regions CA" and CB". A significant advantage of memory transistor 200" is that channel regions CA" and CB" are smaller than floating gates 240A and 240B and more importantly can be smaller than the smallest feature size achievable with the photolithography and etching processes that form floating gates 240A and 240B (e.g., less than or equal to about 0.05 μm for a 0.1-μm process). The relatively larger sizes of floating gates 240A and 240B provides higher capacitive coupling between control gate 240 and floating gates 240A and 240B, which enhances programming efficiency.

The shorter effective channel lengths under floating gates 240A and 240B in memory transistor 200" reduce the effective resistance of each end channel CA" or CB". Reduced effective channel resistance under each floating gate 240A and 240B can be crucial for high performance write and read operations. For a write operation, very short channel lengths CA" and CB" combined with a suitably high drain and control gate voltages effectively make the end channel closest to the drain of memory transistor 200" transparent. In particular, well-known device phenomena such as punch-through and drain-induced barrier lowering (or short channel effects) make the short channel effectively transparent regardless of the charge on the overlying floating gate 240A or 240B. This results in a higher write current and increases channel hot electron injection for faster and more efficient programming.

For a read, the short channel lengths CA" and CB" and sufficiently high read voltages at the drain and control gate can effectively make the channel near the drain transparent through both punch-through and/or drain-induced barrier lowering. The read current is therefore primarily dependent upon the charge stored in the floating gate adjacent the source region, which provides data integrity when reading binary, analog, or multi-bit values.

Figure 3:
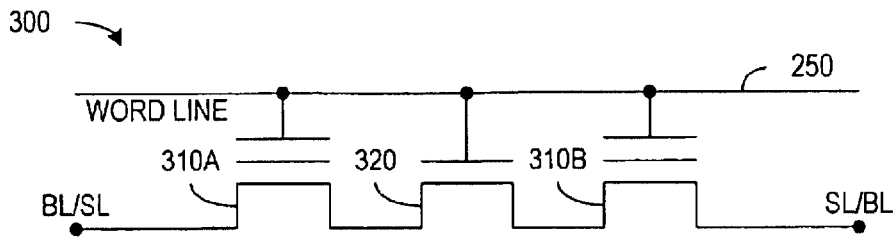
FIG. 3 is a circuit diagram illustrating a circuit equivalent of the memory transistor of FIG. 2A or 2B.

Memory transistor 200' of FIG. 2A and memory transistor 200" of FIG. 2B have the same equivalent circuit diagram and are referred to generically in following as memory transistors 200. (Similarly, channel regions CA' and CB' and channel regions CA" and CB" are generically referred to in the following as channel regions CA and CB.) FIG. 3 illustrates an equivalent circuit 300 for a memory transistor 200. Equivalent circuit 300 includes a floating gate transistor 310A, an N-channel transistor 320, and a floating gate transistor 310B connected in series. Floating gate transistors 310A and 310B have channel lengths and widths respectively corresponding to end channel regions CA and CB, and N-channel transistor 320 has a channel length and width corresponding to central channel region CC.

Operations applying appropriate voltages to the terminals of memory transistor 200 can erase, program, or read memory transistor 200. One erase operation sets the charge state of both floating gates 240A and 240B to an erased state, which in the exemplary embodiment of the invention is a low or negative threshold voltage state for channel currents in both directions. A programming operation changes the charge state of one of floating gates 240A and 240B and correspondingly the threshold voltage for channel current in a direction associated with the floating gate being nearest the source-biased region. A read operation senses the threshold voltage or the amount of channel current in the direction associated with the floating gate being read.

Figure 4A:
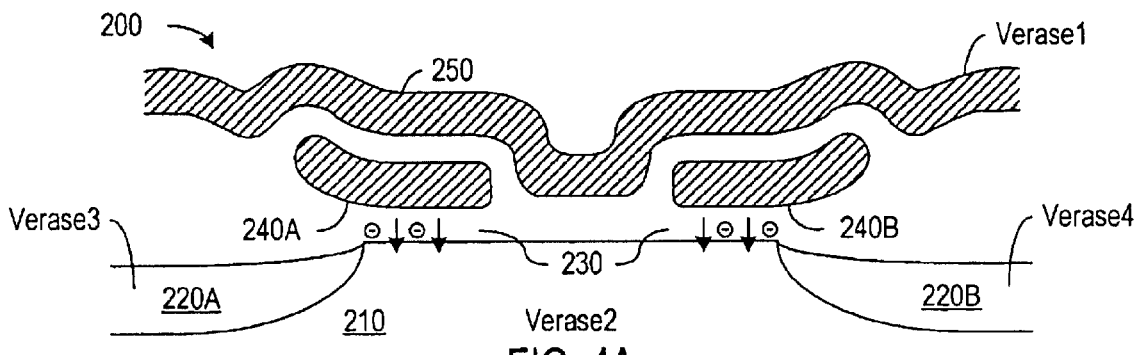
FIGS. 4A and 4B illustrates alternative erase operations for memory transistors in accordance with an embodiment of the invention.

An erase operation can be conducted using methods similar to erase methods known for conventional floating gate transistors. FIG. 4A illustrates an example of a negative-gate channel erase process. The illustrated erase process biases control gate 250 at a negative voltage Verase1 (e.g., about −10 to −12 volts), biases a p-well or p-type substrate 210 to a positive voltage Verase2 (e.g., about 5 to 10 volts), and allows source/drain regions 220A and 220B to float. Accordingly, voltages Verase3 and Verase4 are not applied voltage but are instead the result of the biasing of control gate 250 and p-well for this type of erase operation. As a result, electrons in floating gates 240A and 240B tunnel through tunnel oxide 230 to substrate 210 to lower the threshold voltages associated with both floating gates 240A and 240B. The gate oxide over central channel region CC can be thicker than the tunnel oxide under floating gates 240A and 240B to minimize tunneling between control gate 250 and channel CC. However, a limited amount of tunneling between control gate 250 and substrate 210 is acceptable.

Figure 4B:
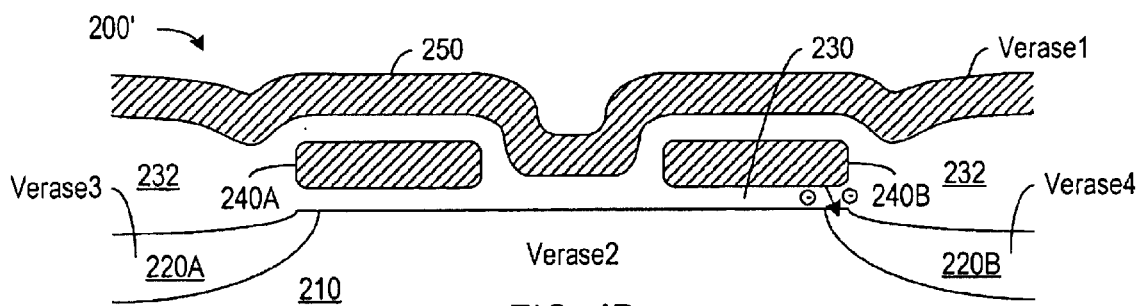

Alternatively, memory cell 200 can be erased using a source-side erase such as illustrated in FIG. 4B. For this type of erase operation, the control gate erase voltage Verase1 is at ground or a negative voltage, the p-well voltage Verase2 is grounded, and source/drain voltage Verase3 and/or Verase4 is positively biased to about 5 volts or more. This biasing generally causes hole injection due to band-to-band tunneling, which neutralizes electrons stored in the floating gate. However, band-to-band tunneling and hole injection generally requires large capacity charge pumps to drive the source current and can induce charge trapping that degrades endurance. To minimize this effect, the source/drain voltage Verase3 or Verase4 can be slowly ramped up in voltage so that the voltage of the floating gate or gates being erased correspondingly increases. The source-side erase can thus be tunnel-current limited instead of voltage limited. For the source side erase, tunnel oxide 230 can be thicker. Additionally, one or both of floating gates 240A and 240B can be erased by positively biasing the source/drain regions 220A or 220B adjacent the floating gate or gates being erased.

The source-side erase process using a tunnel-current limited biasing of source/drain region 220A or 220B and a negative biasing on control gate 250 may more easily erase a memory transistor 200 to a lower threshold voltage state (e.g., a more negative threshold voltage) than can other techniques. In particular, a control gate voltage Verase1 of about −10 volts combined with a tunnel-current limited source/drain voltage Verase3 or Verase4 of about 10 volts can erase a floating gate to achieve a negative threshold voltage. This erase technique could also be applied to conventional floating gate transistors or split gate memory cells, particularly to achieve negative threshold voltage.

With any of the above erase methods, a verify operation can determine when the erase operation has driven the threshold voltages of memory transistors to the desired erased level. One type of verify operation senses bit line current while the word lines are at a voltage corresponding to the target threshold. The direction of the current through the memory transistors can be switched during the verify operation. Bit line current below a sensing threshold for current in both directions indicates all of the floating gates have reached the target erased state.

The erase process can "over-erase" memory transistor 200 so that floating gates 240A and 240B are positively charged and the threshold voltages associated with channel regions CA and CB are near or below 0 volts. Generally, erase voltages are chosen according to the desired threshold voltage for the erased state of memory transistor 200. For a very low threshold voltage (e.g., −3.3 volts or lower), the negative gate source-side erase process uses erase voltages Verase1 and Verase3/Verase4 that are about −10 volts and +10 volts respectively to positively charge floating gates 240A and 240B. Channel regions CA and CB would then operate in depletion mode at least in the erased state. Control gate 250 modulating central channel region CC, which has a positive threshold voltage, permits low threshold voltages for data storage associated with channel regions CA and CB, without introducing unacceptable current leakage during operation of a memory array.

A memory device using conventional floating gate transistors, in contrast to memory transistors 200, must avoid erasing floating gate memory transistors to low threshold voltages. If the threshold voltage were too low in a conventional Flash memory, unselected memory cells would leak unacceptable amounts of current, especially when a large number of unselected memory cells connect to the same bit line. Accordingly, the lowest usable threshold voltage for a conventional floating gate memory device must typically be substantially greater than 0 volts, e.g., greater than about 1.5 volts. This significantly reduces the useful threshold voltage range because the upper limit of the useful threshold voltage range is often limited to no more than about 5 volts because of cell disturb and reliability limitations.

Figure 4C:
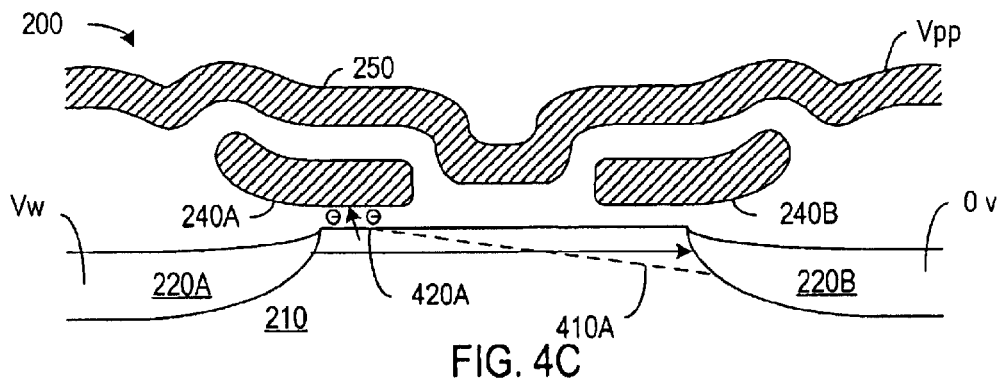
FIGS. 4C and 4D illustrate programming operations for memory transistors in accordance with an embodiment of the invention.

FIG. 4C illustrates an example of programming of floating gate 240A in memory transistor 200. For the illustrated programming operation, control gate 250 is biased to a high voltage Vpp (e.g., 8 to 12 volts). Source/drain region 220A, which is adjacent the floating gate being programmed, is biased to a write voltage Vw (e.g., 4 to 6 volts), and the opposite source/drain region 220B is grounded. Accordingly, the channel current flows from drain 220A to source 220B, and the charge carriers being predominantly electrons flow in the opposite direction. In the channel regions of memory transistor 200, the high voltage Vpp of control gate 250 creates an inversion region 410A having a pinch-off point 420A. The voltage Vw at the drain regions 220A and high voltage Vpp on control gate 250 control the pinch-off point and are selected so that pinch-off point is always under floating gate 240A during the programming operation illustrated in FIG. 4A. At the pinch-off point, the channel current injects hot channel electrons into floating gate 240A, but the charge (if any) in floating gate 240B remains substantially unchanged. As described further below, the negative charge in floating gate 240A increases the threshold voltage for channel current flow from region 220A to 220B, and the programming operation can be stopped when a verify operation determines that the threshold voltage has reached a target level corresponding to the data value (binary, analog, or multi-bit) being written.

Figure 4D:
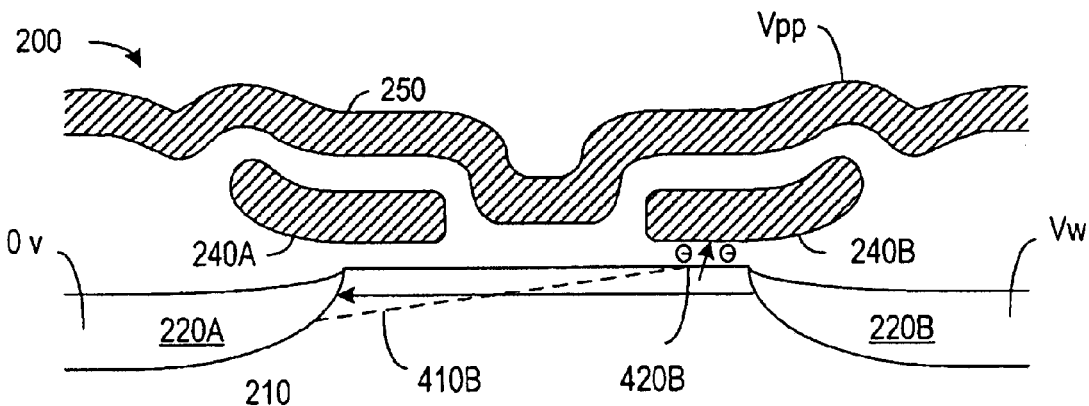

FIG. 4D illustrates an inversion region 410B having a pinch-off point 420B for programming floating gate 240B. Programming the floating gate 240B is performed in the same manner as programming of floating gate 240A except that region 220A is grounded and region 220B is at write voltage Vw during programming of floating gate 240B.

Figure 4E:
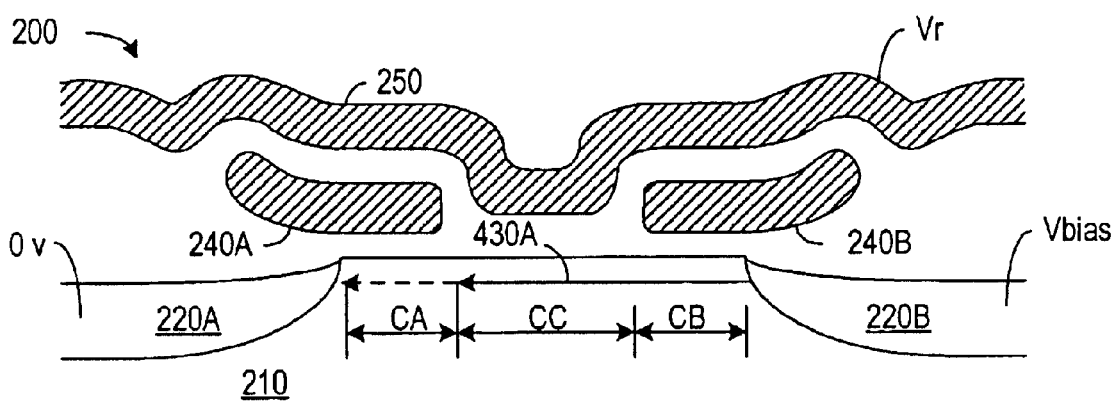
FIGS. 4E and 4F illustrate read operations for memory transistors in accordance with an embodiment of the invention.

FIG. 4E illustrates an example of a read operation that determines a data value indicated by the charge state of floating gate 240A. For the read operation, control gate 250 is biased at a read voltage Vr that is above the upper boundary of the threshold voltage ranged used for storing data. The read operation for floating gate 240A biases region 220B to a read voltage Vbais (e.g., about 1 to 2 volts), grounds region 220A, and compares the current through memory transistor 200 with one or more reference current. The read voltage Vbias can be higher than drain voltages conventionally used for read operations in conventional Flash memory because memory transistor 200 is less susceptible to read disturb. Drain-induced barrier lowering (also known as the short channel effects) and/or the punch-through effect greatly reduce the resistance of the channel region CB so that the charge state of floating gate 240B does not significantly affect the current during the read operation.

Central channel CC ideally operates as a transistor in the linear mode during the read operation. Control gate 250 directly modulates channel region CC so that the threshold voltage associated with the central channel regions CC is not subject to capacitive coupling effects between control gate 250 and an intervening floating gate. Central channel region CC can additionally have a lighter doping from channel regions CA and CB to adjust the threshold voltage of channel regions CC for optimal performance. The read operation of FIG. 4E ideally biases channel region CA for a saturation or near-saturation current at a level that depends on the threshold voltage for channel region CA. Provided that channel CB is sufficiently transparent, other operating modes for channels CA and CC provide current with a measurable dependence on the charge state of floating gate 240A. Accordingly, comparing the current through memory transistor 200 to one or more reference currents will indicate charge state or a threshold voltage associated with floating gate 240A and channel regions CA. Reference cells having the same basic structure and biasing as memory transistor 200 but with known charge states and threshold voltages can provide the reference currents. The comparisons can thus indicate a data value associated with floating gate 240A.

Figure 4F:
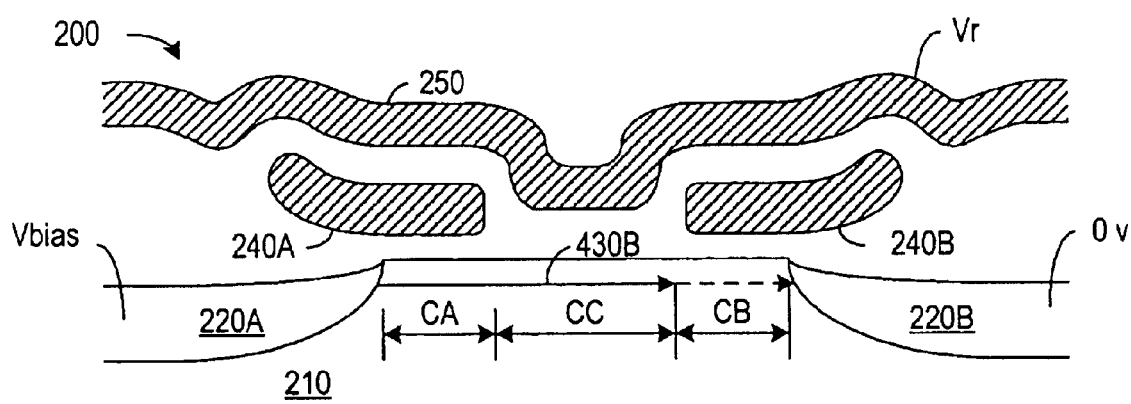

FIG. 4F illustrates the direction of a read current 430B and the bias voltages for reading a data value associated with floating gate 240B. Reading the data value associated with the floating gate 240B is performed in the same manner as reading floating gate 240A except that region 220A is at bias voltage Vbias and region 220B is grounded when reading floating gate 240B.

The practical threshold voltage range usable for storing data generally depends on the supply voltage and cell disturb, data retention, and endurance effects at both extremes of the threshold voltage range. The desired read time is also a consideration in selecting the boundaries of the threshold voltage range. In particular, if a device uses a threshold voltage greater than the supply voltage (e.g., greater than 3.0 volts), reading the device may require a charge pump or voltage boosting circuit that drives the selected word line to a voltage Vr that is greater than the maximum threshold voltage (e.g., 5.0 volts). Charging the word line with a charge pump can slow the read speed in random access mode.

Table 1 illustrates relationships among the voltage VFG of a floating gate (e.g., 240A or 240B) when an overlying control gate 250 is at 0 volts (grounded), the type of excess charge on the floating gate, and the threshold voltage associated with the floating gate. Table 1 presumes that the channel underlying the floating gate is such that charge inversion occurs when the floating gate is at 1 volt and that control gate 250 has a 60% capacitive coupling to the floating gate.

TABLE 1

| VFG @ $V_{WL} = 0$ | Excess Charge Stored in Floating Gate | Threshold Voltage (Word Line Voltage $V_{WL}$ Require to Turn On/Turn Off for +Vt/−Vt) |
|---|---|---|
| −3 V | Electrons | ≈6.7 V |
| −2 V | Electrons | ≈5.0 V |
| −1 V | Electrons | ≈3.3 V |
| 0 V | No Excess Charge | ≈1.7 V |
| +1 V | Holes | ≈0 V |
| +2 V | Holes | ≈−1.7 V |
| +3 V | Holes | ≈−3.3 V |
| +4 V | Holes | ≈−6.7 V |

A conventional memory using floating gate transistors is generally limited to using a threshold voltage range starting above about 1.7 volts and extending to less than about 5.0 volts. Typically, for conventional floating-gate memory transistors, the lower limit cannot be lowered without increasing current leakage through unselected memory transistors, and the upper limit cannot be raised without sacrificing data retention and endurance, increasing cell disturb, and/or increasing the supply voltage or using a charge pump circuit to drive the selected word line. In contrast, memory transistor 200 can use a threshold voltage range from the normal upper limit (e.g., 5.0 volts) down to a lower limit that includes negative threshold voltages (e.g., −1.7 to −6.7 volts) depending on the erase scheme used. The larger threshold voltage range of memory transistor 200 facilitates storing multiple bits per floating gate because more or larger threshold voltage bins corresponding to different digital values can be fit into the larger threshold voltage range and the separation between the various threshold voltage levels is a larger percentage of the magnitude of the threshold voltage levels.

In accordance with another aspect of the invention, the threshold voltage range for data storage can be selected so that all data values correspond to floating gates 240A and 240B having positive charge (or holes). For the memory transistor of Table 1, a threshold voltage range having an upper limit of +1.7 limits the floating gates 240A and 240B to storing only positive charge or holes. Using holes for data storage can result in better data retention because the potential barrier for holes is considerably higher than the potential barrier for electrons. Lowering the upper limit of the threshold voltage range reduces cell disturb but may also reduce the punch-through effect since the channel region CB or CA underlying the unselected floating gate 240B or 240A in the read operations of FIG. 4E or 4F may always be conductive. However, the short channel effect will still make the channel region CB or CA underlying the unselected floating gate 240B or 240A nearly transparent. Accordingly, using the lower threshold voltage range would not reduce the accuracy of reading the stored value associated with the selected floating gate 240A or 240B. For write operations, the word line voltage Vpp may need to be lower to compensate for the increase in channel current.

Figure 1:
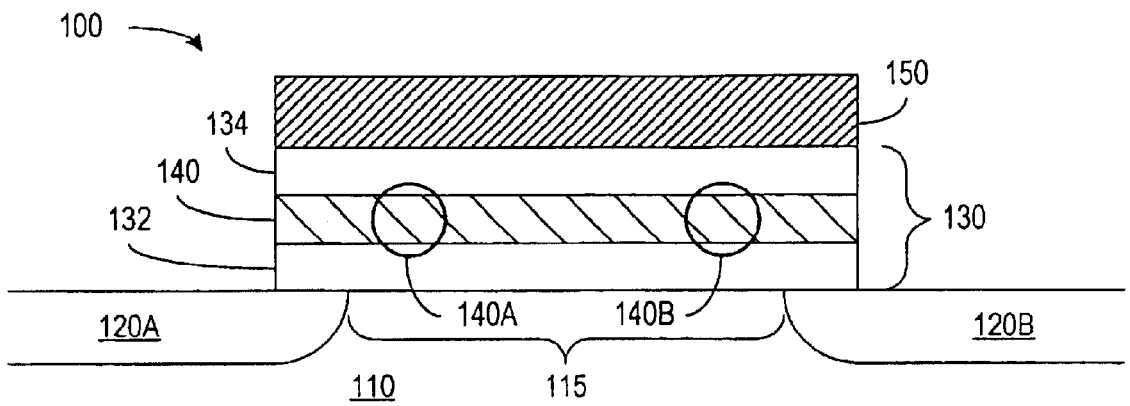
FIG. 1 is a cross-sectional view of a conventional 2-bit memory cell.

Memory transistors in this embodiment of the invention can store more information per floating gate and provide more dense storage than do conventional memories. For comparisons of the relative integrated circuit area required per bit, FIGS. 5A, 5B, 5C, and 5D respectively show plan views of a conventional contactless (buried diffusion virtual ground) Flash memory cell 500 (i.e., a floating gate transistor), the 2-bit memory cell 100 of FIG. 1, memory transistor 200' of FIG. 2A, and memory transistor 200" of FIG. 2B.

Figure 5A:
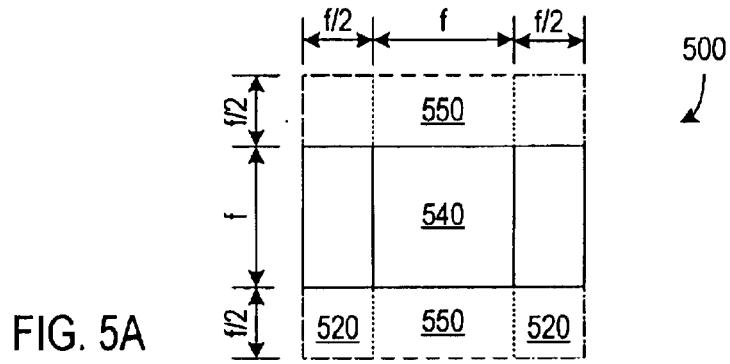
FIGS. 5A and 5B show the areas of known memory cells.

Memory cell 500 of FIG. 5A includes a floating gate 540 over a channel (not shown), source/drain regions 520, and isolation areas 550. The size of floating gate 540 generally depends on the minimum feature size f for patterning of a layer (e.g., the first or second polysilicon layer) to form floating gate 540. In FIG. 5A, floating gate 540 has the minimum size of f×f. Adjacent floating gate transistors in a memory array (not shown) are at least a distance f away from floating gate 540, and for the purpose of determining the integrated circuit area per bit, half of that separation (i.e., f/2) all around floating gate 540 is attributed to memory cell 500. Similarly, memory cell 500 typically shares source/drain regions 520 with adjacent memory cells (not shown) in the memory array, and only half of each shared source/drain region 520 is attributed to the area of floating gate transistor 500. As a result, memory cell 500 occupies an area that is 2f×2f and thus requires an area of $4f^2$ per bit for conventional binary storage.

Figure 5B:
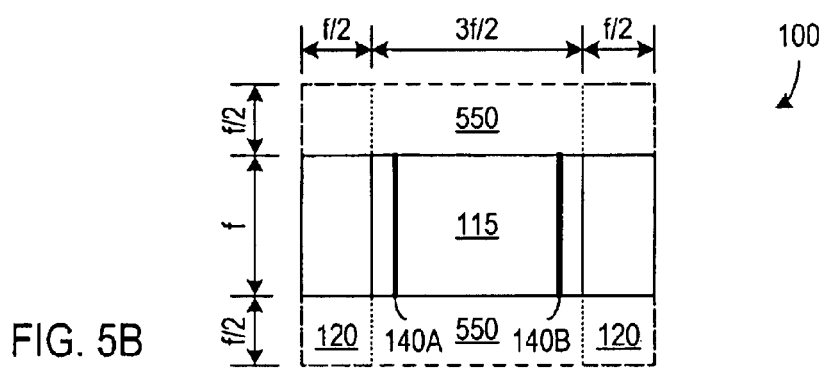

FIG. 5B shows the 2-bit memory cell 100, which includes a channel region 115, source/drain regions 120, and isolation regions 550. Memory cell 100 requires separation between locations 140A and 140B to avoid leakage of trapped charge between locations 140A and 140B. With current integrated circuit fabrication capabilities, channel 115 requires a width of about 1.5f to provide the necessary separation between locations 140A and 140B. In addition to the channel area, the area of memory cell 100 includes half of the minimum separation (e.g., f/2) between memory cells. The area of memory cell 100 is thus 2.5f×2f or $5f^2$. Although the area $5f^2$ of memory cell 100 is larger that the area $4f^2$ of binary memory cell 500, memory cell 100 stores two bits, making the effective area per bit 2.5 $f^2$.

Figure 5C:
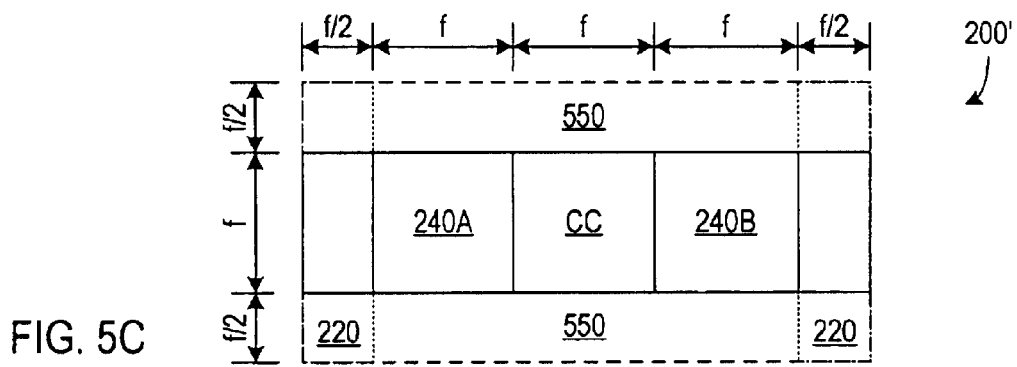
FIGS. 5C and 5D show the area of memory transistors in accordance with the embodiments of the invention illustrated in FIGS. 2A and 2B, respectively.

FIG. 5C shows a plan view of memory transistor 200' illustrated in FIG. 2A. Memory transistor 200' includes two floating gates 240A and 240B, a central channel region CC, source/drain regions 220, and isolation regions 550. The size and separation of floating gates 240A and 240B depends on the minimum feature size f, and the length of memory cell 200' is 4f including length f for each of floating gates 240A and 240B and channel region CC and half that length f/2 for each source/drain region 220. The width of memory cell 200' is 2f, which is the same as the width of memory cell 100 or 500, making the area of memory cell 200' 4f×2f or 8f².

Figure 5D:
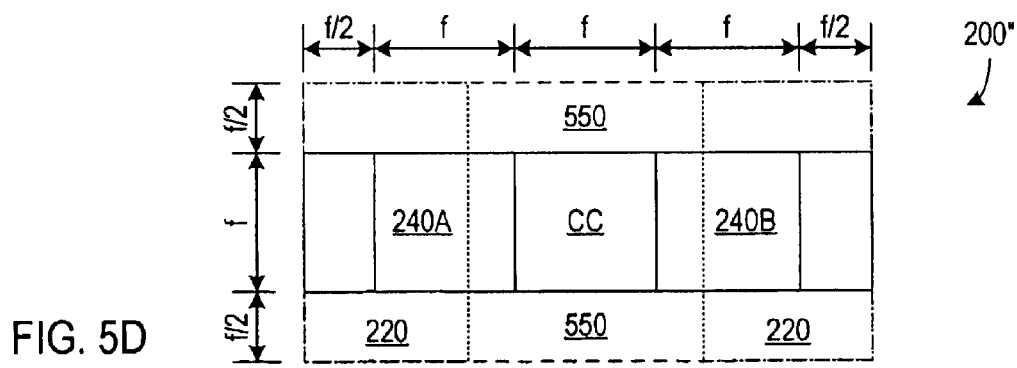

FIG. 5D shows the layout of memory transistor 200" of FIG. 2B. Memory transistor 200" occupies the same overall area (i.e., about 8f²) as memory transistor 200'. However, the areas of source/drain regions 220 in memory transistor 200" are larger than the areas of source/drain memory transistor 200'. The larger source/drain regions 220 increase the width and can lower the resistance of buried diffusion lines in a contactless memory array. The wider diffused lines 220 may avoid the need for metal strapping which periodically connects the buried diffusion lines 220 to overlying metal lines to reduce resistance or alternatively allow larger banks of memory cells 200". Since the source/drain regions extend under floating gates 240A and 240B, the increased width and lower resistance of the buried diffusion lines are achieved without increasing the total area of the memory transistor. The shorter effective channel length for channel regions CA" and CB", which results from source/drain regions 220A and 220B extending under floating gates 240A and 240B, helps improve the performance of program and read operations.

Memory transistors 200 can store one or more bits per floating gate, which reduces the circuit area per bit of stored data. Table 2 indicates the area per bit for one, two, three, and four bits per floating gate. As indicated in Table 2, at two bits per floating gate, memory transistor 200 provides 100% and 20% more storage per circuit area than do binary memory cell 500 and 2-bit memory cell 100, and at four bits per floating gate, memory transistor 200' provides 4 times and 2.5 times as much storage when compared to memory cells 500 and 100, respectively.

TABLE 2

Circuit Area per Bit for a Twin-Floating-Gate Memory Transistor

| Number of Bits per Floating Gate | Circuit Area per Bit |
|---|---|
| 1 | $4f^2$ |
| 2 | $2f^2$ |
| 3 | $4f^2/3$ |
| 4 | $f^2$ |

The area per bit for memory transistor 200 (FIGS. 5C and 5D) is the same as the area per bit for memory cell 500 (FIG. 5A) when both store the same number of bits per floating gate. However, memory transistor 200', which includes central channel region CC modulated by control gate 250, can be over-erased (e.g., to a threshold voltage of 0 V or less) and still not have leakage current when control gate 250 is grounded to unselect a row of an array. In contrast, leakage through conventional memory cell 500 would be unacceptable for operation in a memory array if the threshold voltage of memory cell 500 were too low (e.g., below about 1.7 volts). Accordingly, memory transistor 200' has a larger range of threshold voltages usable to represent data than is possible in memory cell 500, and memory transistor 200' can therefore more easily store more information per floating gate with higher performance. Additionally, as noted further below, arrays of memory transistors 200 provide a wider pitch for layout of array support circuits and lower coupling effects between global bit lines.

A variety of memory array architectures are available for assembling dual-floating gate memory transistors into memory arrays. One such memory array architecture is referred to herein as a contactless memory array architecture. In a contactless architecture, each memory transistor has source/drain regions that are portions of diffused lines in the substrate, and instead of having contacts from overlying layers directly to the source/drain regions of each memory transistors, banks of memory transistors generally have such electrical connections only at the ends of the banks. This can reduce the integrated circuit area per memory transistor by reducing the required contact area.

Figure 6:
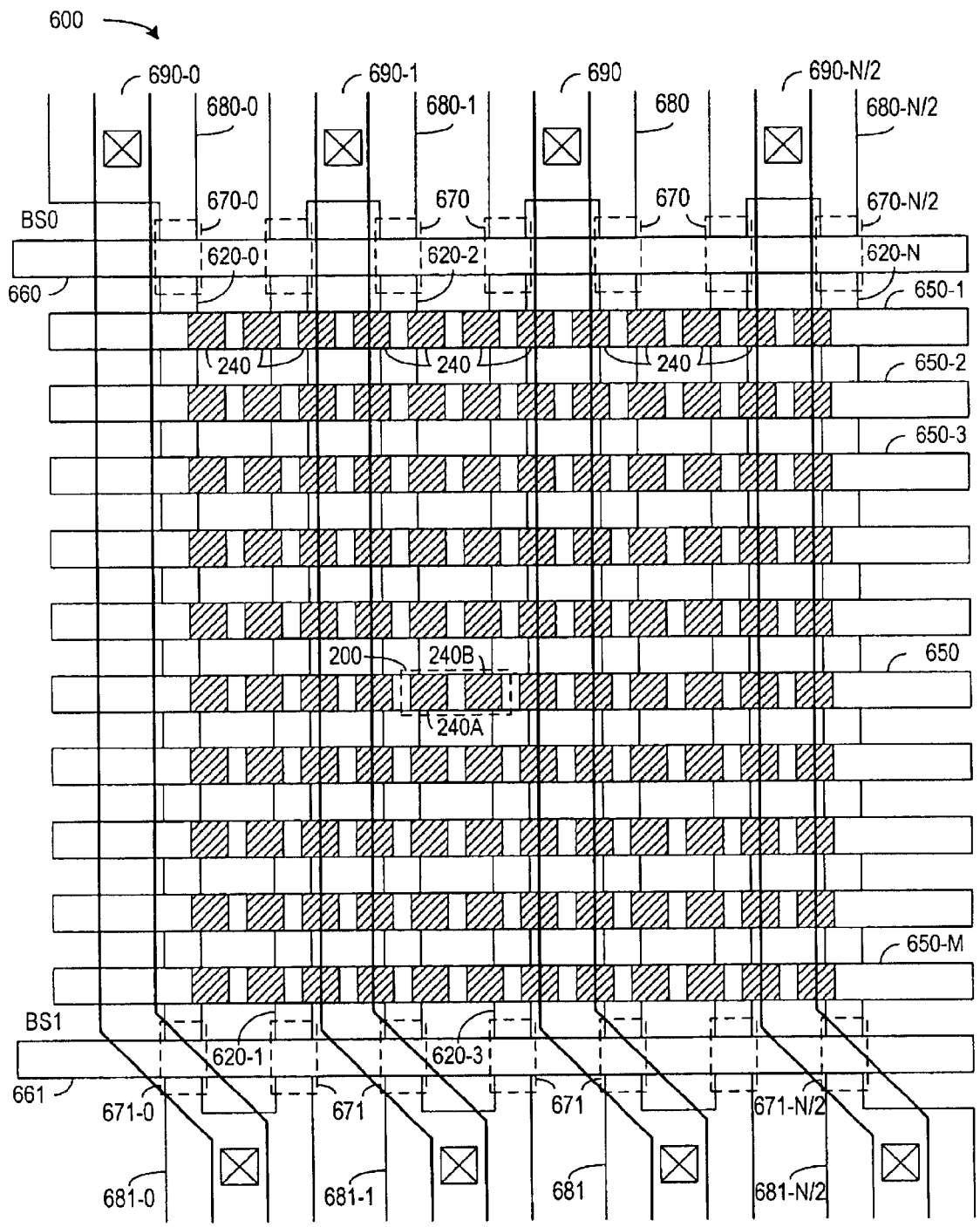
FIG. 6 is a plan view of a bank of a memory array in accordance with an embodiment of the invention.

FIG. 6 shows a layout of an M-by-N bank 600 of memory transistors 200 having a contactless architecture in accordance with an embodiment of the invention. Bank 600 includes 2N×M storage locations since each memory transistor contains two storage locations (i.e., two floating gates 240.) In a typical bank, the number of rows M is on the order of 64, and the number of columns N could be up to 1024 or more for high-density memory. Bank 600 includes N+1 diffused lines 620-0 to 620-N, generically referred to herein as diffused lines 620, and M word lines 650-1 to 650-M, generically referred to herein as word lines 650. In the exemplary embodiment of the invention, diffused lines 620 are in a p-well inside a deep n-well of an underlying p-type substrate and run in the direction of the N columns in bank 600. Word lines 650 are part of an overlying conductive layer (typically a second polysilicon layer) and run in the directions of the M rows of bank 200. Word lines 650 can be periodically strapped to overlying metal word lines (not shown) to reduce resistance.

Figure 7A:
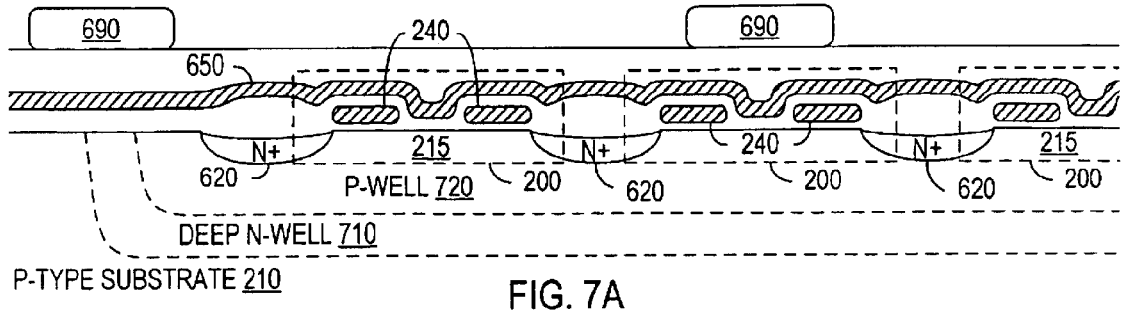
FIGS. 7A and 7B are cross-sectional views of portions of a row of memory cells in memory arrays in accordance with alternative embodiments of the invention.
Figure 7B:
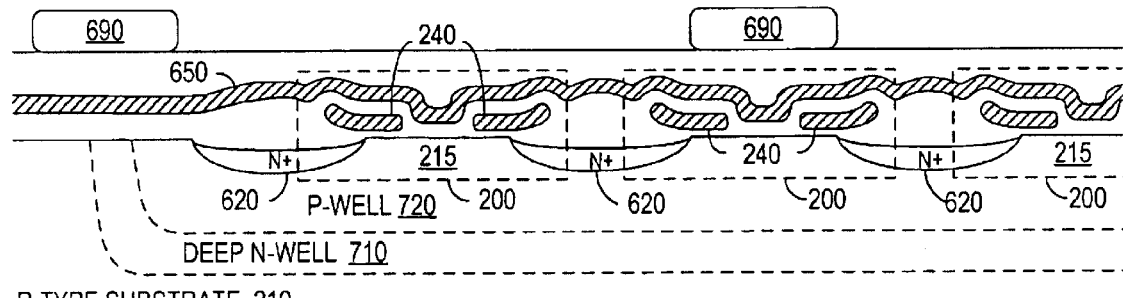

FIGS. 7A and 7B show cross-sections of bank 600 that are parallel to and through a word line 650. FIG. 7A shows an embodiment where each memory transistor has the form of memory transistor 200' of FIG. 2A, and FIG. 7B shows an embodiment where each memory transistor has the form of memory transistor 200" of FIG. 2B. Each cross-section crosses through diffused lines 620 that are formed in substrate 210. In the exemplary embodiment, semiconductor substrate 210 is a p-type substrate containing a p-well 720 inside a deep n-well 710. Deep n-well 710 and p-well 720 have contacts (not shown) that permit independent biasing. Using this double-well structure permits biasing p-well 720 at a positive voltage for a negative-gate erase process such as described above.

Diffused lines 620 are regions of n+ doping in p-well 620. Diffused lines 620 can be formed of salicide that is buried in semiconductor substrate 210 to reduce the resistance of diffused lines 620. Formation of salicide for diffusion regions is well known for high-speed logic and memory processes, including contactless Flash memory arrays. Alternatively, metal lines (not shown) can periodically strap diffusion lines 620 to reduce resistance. Portions of the diffused lines 620 that are under word lines 650 form source/drain regions 220 of memory transistors 200.

Each memory transistor 200 includes source/drain regions 220, a channel region 215, a pair of floating gates 240, and a control gate as described above. Channel regions 215 are in the p-well 720 and between diffused lines 620. Isolation structures such as shallow trench isolation, field oxide isolation, and/or heavily doped p+ field implant regions (not shown) separate channel regions that are in the same column of bank 600, i.e., between the same pair of diffused lines 620.

Floating gates 240 are between respective channel regions and associated word lines 650. Each floating gate 240 corresponds to a different storage location and is charged according to the value stored at that storage location. Floating gates 240 are typically formed from a first polysilicon layer, and a thin insulator layer such as a tunnel oxide layer separates the floating gates 240 from respective end regions CA and CB of channel 215 in memory transistors 200. Patterning of a second polysilicon layer forms word lines 650 that are over floating gates 240 with an insulating layer, typically an oxi-nitride-oxide (ONO) layer, between word lines 650 and the underlying floating gates 240. Word lines 650 also extend into gaps between pairs of the floating gates to modulate central portions CC of channel regions 215 as described above. The oxide separating control gate 650 and channel region CC can be formed or processed separately from the tunnel oxide under floating gates 240 to provide a greater oxide thickness similar to that found in some split-channel Flash memory cells.

As shown in FIG. 6, N/2+1 metal lines 690-0 to 690-N/2 via contact areas 680-0 to 680-N/2 respectively connect to N/2+1 bank select cells 670-0 to 670-N/2 and via contact areas 681-0 to 681-N/2 respectively connect to N/2+1 bank select cells 671-0 to 671-N/2. Bank select cells 670 are at the ends of diffused lines 620 opposite to the ends connected to bank select cells 671. Excluding bank select cells 670-0 and 671-N/2, which are at edges of bank 600, each bank select cell 670 or 671 operates as a switch between the corresponding metal line 690 and a pair of adjacent diffused lines 620.

Connections of bank select cells 670 to respective pairs of diffused lines 620 are staggered relative to the connections of bank select cells 671 to respective pairs of diffused lines 620. More specifically, bank select cell 670-0 is between metal line 690-0 and diffused line 620-0. Bank select cell 671-0 is between metal line 690-0 and a pair of diffused lines 620-0 and 620-1. Bank select cell 670-1 is between metal line 690-1 and a pair of diffused lines 610-1 and 610-2, and bank select cell 671-1 is between metal line 690-1 and a pair of diffused lines 610-2 and 610-3. This pattern continues up to bank select cell 670-N/2, which is between metal line 690-N/2 and diffused lines 620-(N-1) and 620-N, and bank select cell 671-N/2, which is between metal line 690-N/2 and diffused line 620-N.

Bank select lines 660 and 661, which can be formed from the polysilicon layer (typically poly2) forming word lines 650 or from a polysilicon layer forming peripheral transistors, respectively control bank select cells 670 and 671. Activation of a select signal BS0 on bank select line 660 simultaneously turns on all bank select cells 670 in bank 600, so that bank select cells 670 electrically connect metal lines 690 to diffused lines 620. Activation of a bank select signal BS1 on bank select line 661 simultaneously turns on all bank select cells 671 in bank 600, and bank select cells 671 electrically connect metal lines 690 to diffused lines 620.

The architecture of bank 600 and particularly the connection of metal lines 690 to diffused lines 620 in bank 600 are similar to and amenable to variations as in architectures and connections described in a co-owned U.S. patent application Ser. No. 09/839,973, entitled "Contactless Flash Memory With Buried Diffusion Bit/Virtual Ground Lines" and co-owned U.S. patent application Ser. No. 09/982,136, entitled "Contactless Flash Memory With Shared Buried Diffusion Bit Line Architecture", which are hereby incorporated by reference in their entirety. Bank 600, however, uses dual-floating gate memory transistors, rather than conventional floating gate transistors as in prior contactless memory arrays. As a result, bank 600 has half as many diffused lines 620 and half as many metal lines 690 per floating gate 240 as would a similar array of conventional floating gate transistors, and if the same size floating gates are used, the pitch of metal lines 690 is about twice as wide as the pitch of similar metal lines in banks of conventional floating gate transistors. Accordingly, bank 600 advantageously provides less capacitive coupling between metal bit/virtual ground lines 690. More importantly, the wider pitch for the global metal lines 690 provides more area for layout of array supporting circuits such as column decoding and driving circuits that connect to metal lines 690.

Figure 8A:
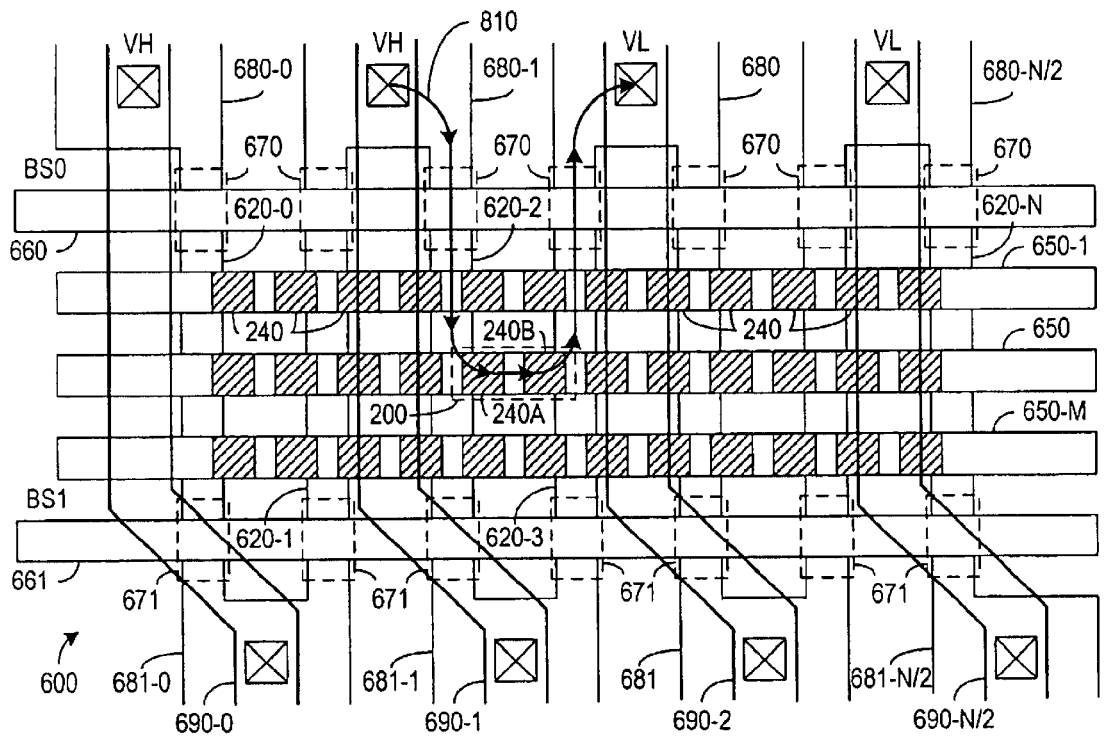
FIGS. 8A, 8B, and 8C illustrate operations accessing different floating gates in the bank of FIG. 6.

FIG. 8A illustrates a path for current 810 during an access of a specific floating gate 240A or 240B in a selected memory transistor 200 in an even-numbered column of bank 600. If the access is a programming operation, current 810 causes channel hot electron injection to program floating gate 240A in the selected memory transistor 200. If the access is a read operation, sensing the magnitude of current 810 determines the data value associated with floating gate 240B in the selected memory transistor 200.

For the access operation of FIG. 8A, conventional row decoders and drivers (not shown) activate the selected word line 650. The voltage activated on the selected word line 650 depends on whether the access is a programming or read operation. For a programming operation, the selected word line is at a programing voltage Vpp, typically about 8 to 12 volts, depending on the target threshold voltage for floating gate 240A, the memory transistors characteristics, and the programming time budget. For a read operation, the selected word line is at read voltage Vr, which is higher than the maximum threshold voltage corresponding to stored data.

Unselected word lines 650-1 to 650-M are biased low (e.g., grounded). The low voltage shuts off all memory transistors 200 in the unselected rows because the low control gate voltage stops charge inversion in the central channel regions CC of all memory transistors 200 in the unselected rows. Current leakage in the unselected rows is thus avoided regardless of the threshold voltages associated with the floating gates 240.

Bank select circuitry (not shown) activates bank select signal BS0 on bank select line 660 to turn on bank select cells 670 in response to an address signal indicating that selected memory transistor 200 is in an even column (e.g., column 2) of bank 600. As a result, bank select cells 670 connect metal lines 690 to diffused lines 620 and particularly connects metal lines 690-1 and 690-2 to diffused lines 620-2 and 620-3, which are on opposite sides of selected memory transistor 200 in column 2. Select signal BS1 on bank select line 661 is deactivated to turn off bank select cells 671.

Column decoding and drive circuits (not shown) drive metal line 690-2 to a low voltage VL (typically ground) and drive metal line 690-1 to a higher voltage VH. Voltage VH is programming voltage Vw (typically about 4.5 to 6 volts) for a programming operation and is the read bias voltage Vbais (typically about 1 to 2 volts) for a read operation.

During the access, bank select cells 670 applies voltage VH from metal line 690-1 to two diffused lines 620-2 and 620-1. To avoid driving current through memory transistors that are to the left of the selected memory transistor 200 in FIG. 8A, all metal lines to the left of metal line 690-1 (in this illustrated example metal line 690-0) are driven to the same voltage VH as metal line 690-1. As a result, all diffused lines 620 to the left of the selected memory transistor 200 in FIG. 8A are approximately at voltage VH, and none of the memory transistors to the left of the selected transistor 200 conduct a current. Similarly, metal line 690-2 and all metal lines 690 to the right of the selected memory transistor 200 are at voltage VL, so that none of the memory transistors to the right of the selected memory transistor conducts a current.

Figure 8B:
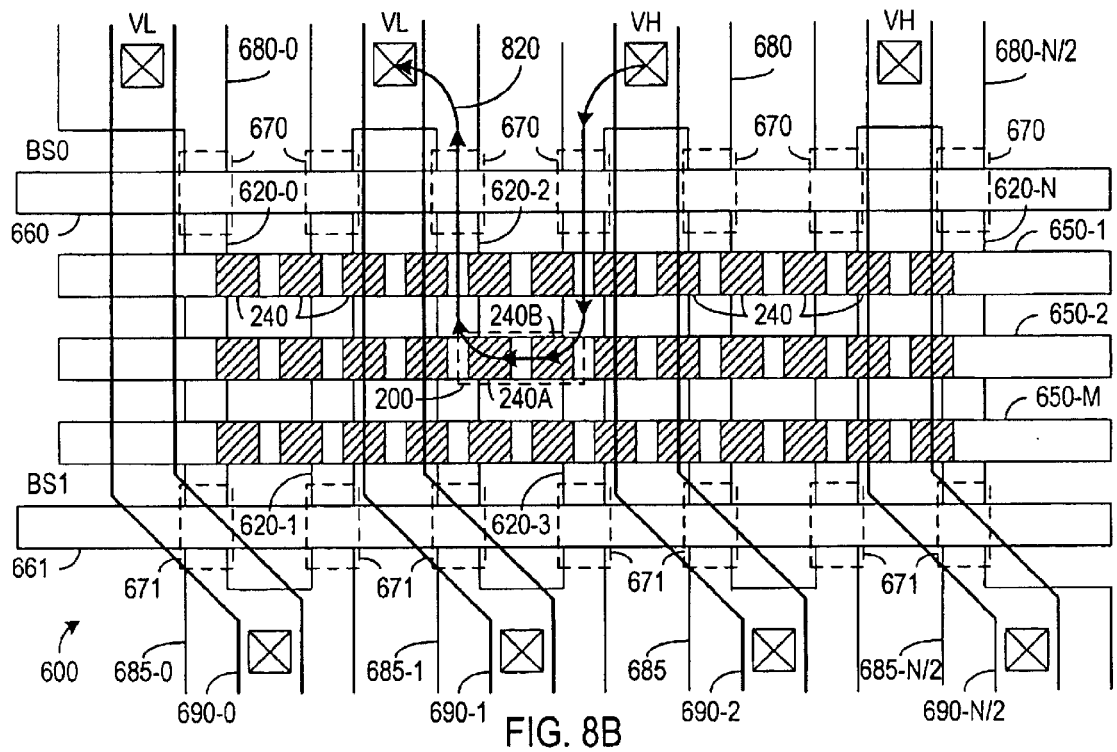

As mentioned above, the direction of current 810 of FIG. 8A is correct for programming floating gate 240A of the selected memory transistor 200 or for reading floating gate 240B of the selected memory transistor 200. To program floating gate 240B or read floating gate 240A, the current direction needs to be reversed. FIG. 8B illustrates a current 820 that is correct for programming floating gate 240B or reading floating gate 240A. For current 820, metal lines 690-0 to 690-1, which are to the left of the selected memory transistor 200, are biased at low voltage VL, and metal lines 690-2 to 690-N/2, which are to the right of the selected memory transistor 200, are biased at higher voltage VH. Bank select signal BS0 on line 660 is activated, and bank select signal BS1 on line 661 is deactivate because the access is to a selected memory transistor 200 in an even row.

Figure 8C:
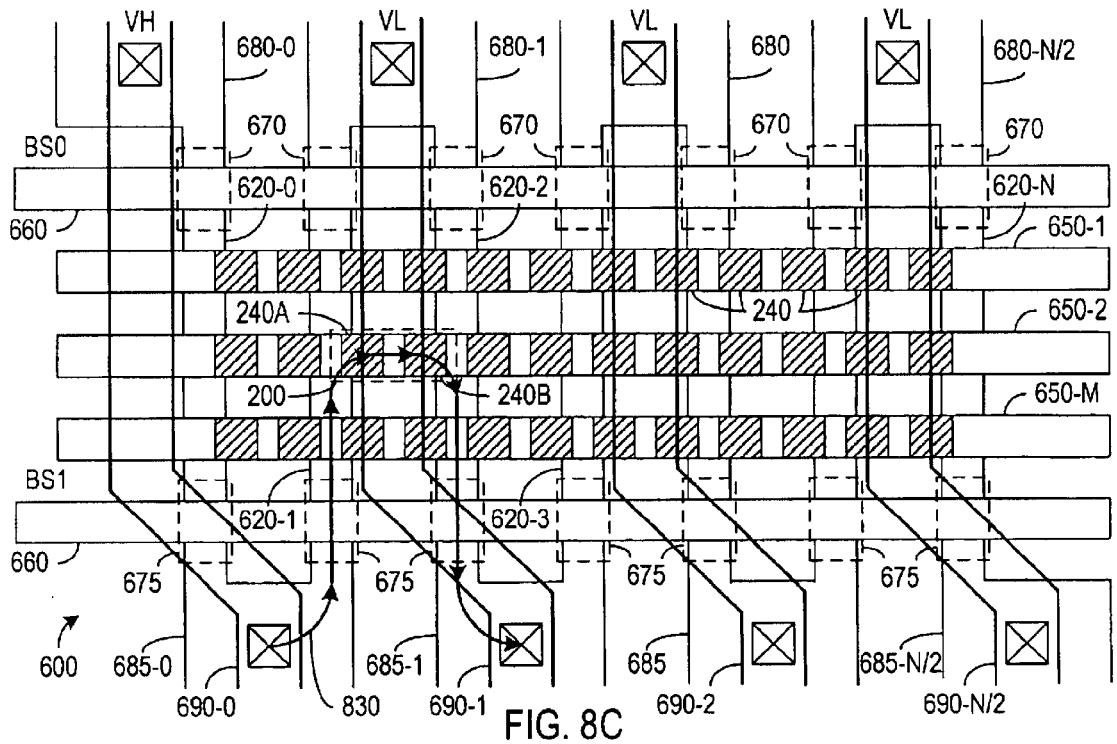

Accesses to memory transistors in odd columns require activating select signal BSI and deactivating select signal BS0, so that bank select cells 671 are "on" and bank select cells 670 are "off." FIG. 8C illustrates a current 830 for an access to a selected memory transistor 200 in an odd column of bank 600. Current 830 is in a direction appropriate for programming floating gate 240A in the selected memory transistor 200 and for reading floating gate 240B in the selected memory transistor 200. Metal lines 690-0 to the left of the selected memory transistor 200 are biased at higher voltage VH and metal lines 690-1 to 690-N/2 to the right are biased at low voltage VL to achieve the illustrated current direction. The direction of current 830 can be reversed by biasing the metal lines 690-0 to the left of the selected memory transistor 200 at low voltage VL and the metal lines 690-1 to 690-N/2 to the right of the selected memory transistor 200 at higher voltage VH for access operations that program floating gate 240B or read floating gate 240A.

Figure 9A:
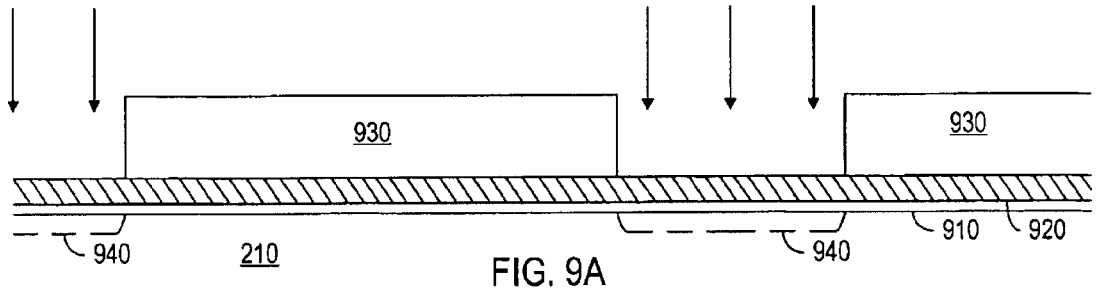
FIGS. 9A, 9B, 9C, 9D, and 9E are cross-sectional views illustrating a fabrication process for a memory device in accordance with an embodiment of the invention.

FIGS. 9A, 9B, 9C, 9D and 9E illustrate cross-sections of structures formed during a fabrication process for the memory transistors and/or memory arrays in accordance with the invention. FIG. 9A shows a structure including a substrate 210, a tunnel oxide layer 910, a first polysilicon layer 920, and a mask 930. Substrate 210 is a P-type silicon substrate in which a deep N-well and a P-well (not shown) have been formed using conventional triple-well techniques. Tunnel oxide 910 is grown or deposited on substrate 210 to a thickness of about 100 Å or less, and first polysilicon layer 920 is deposited on tunnel oxide 910 to a thickness of about 1,000 Å using conventional techniques such as chemical vapor deposition. Mask 930 is a mask patterned using photolithography processes to expose area of substrate 210 to an ion implantation process forming N+ regions 940.

Figure 9B:
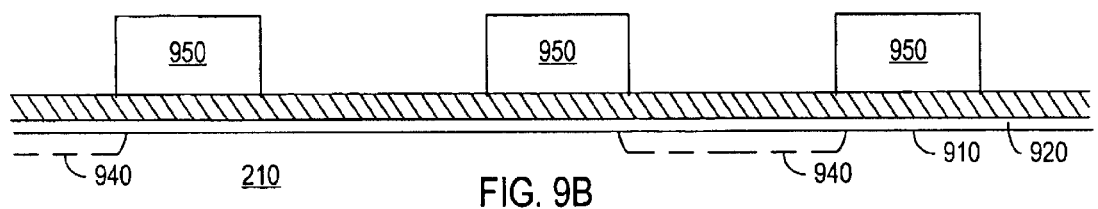
Figure 9C:
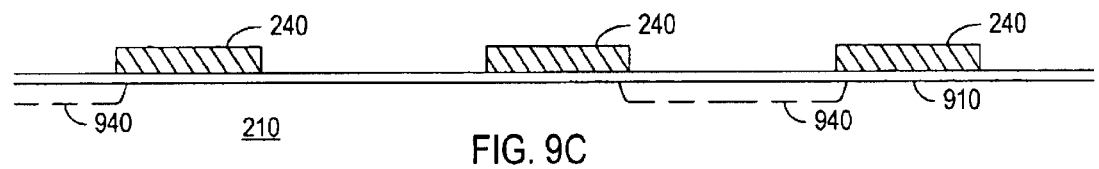

Masked 930 is stripped off or otherwise removed and a second mask 950 is formed as shown in FIG. 9B. Mask 950 defines the boundaries of floating gates 240, which overlap the implanted regions 940. Polysilicon layer 920 is etched away through openings in mask 950 to leave polysilicon floating gates 240 as shown in FIG. 9C. At this point, polysilicon for floating gates 240 can extend continuously along the direction of implanted regions 940. One or more oxidation process applied to the structure of FIG. 9C forms mini oxide isolation regions 232 shown in FIG. 9D. The oxide preferentially grows on implanted regions 940, which expand due to lateral diffusion that heating during the oxidation process causes. After formation of mini oxide isolation regions 232, implantation steps can adjust the threshold voltage of central channel region CC relative to end channel regions CA and CB. A blanket channel implantation step, which occurs early in the process, can set the intrinsic threshold voltage of channel regions CA and CB. The tunnel oxide between the floating gates can be reformulated if desired after adjusting the threshold voltage of the central channel region CC.

Figure 9D:
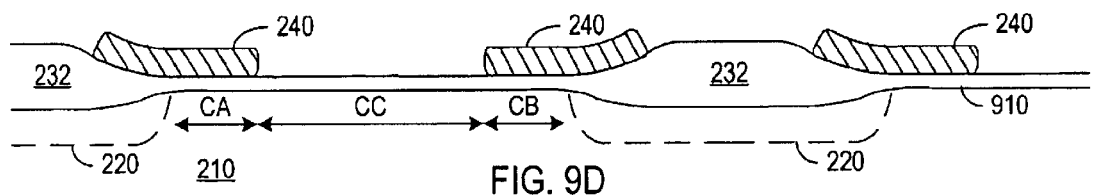
Figure 9E:
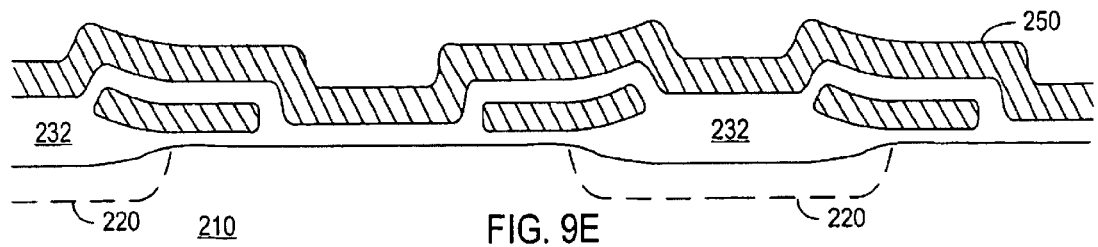

FIG. 9E shows the final structure which is formed from the structure of FIG. 9D by deposition of an inter-poly insulating layer such as an ONO layer and deposition and patterning of a second polysilicon layer to form the word lines or control gate 650. The etching that defines word lines or control gates 250 can further etch the first polysilicon layer so that edges of floating gates 240 along the direction of diffused lines or regions 220 are self-aligned with control gates 250.

Figure 10A:
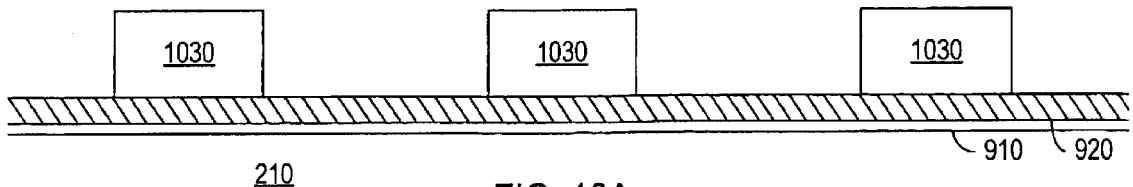
FIGS. 10A, 10B, 10C, 10D, and 10E are cross-sectional views illustrating another fabrication process for a memory device in accordance with an embodiment of the invention.
Figure 10B:
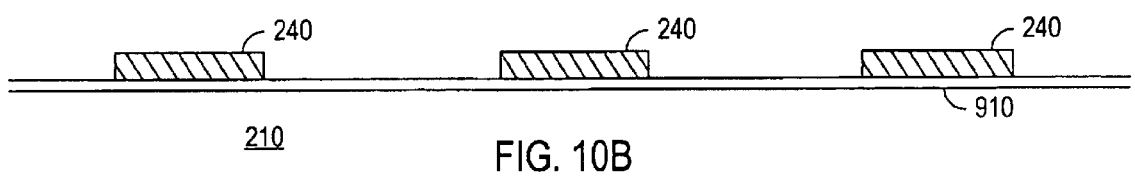

FIGS. 10A, 10B, 10C, 10D and 10E illustrate cross-sections of structures formed during another fabrication process for the memory transistors and/or memory arrays in accordance with the invention. FIG. 10A shows a structure including a substrate 210, tunnel oxide layer 910, first polysilicon layer 920, and a mask 1030. Mask 1030 defines the areas of floating gates 240. FIG. 10B shows floating gates 240 after an etching process patterns polysilicon layer 920 and after mask 1030 is remove.

Figure 10C:
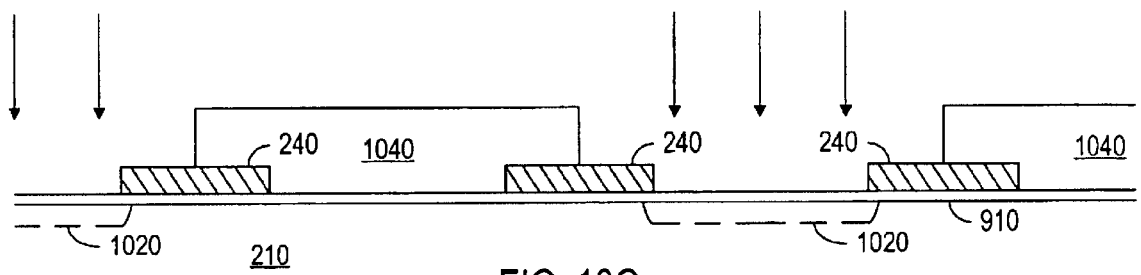
Figure 10D:
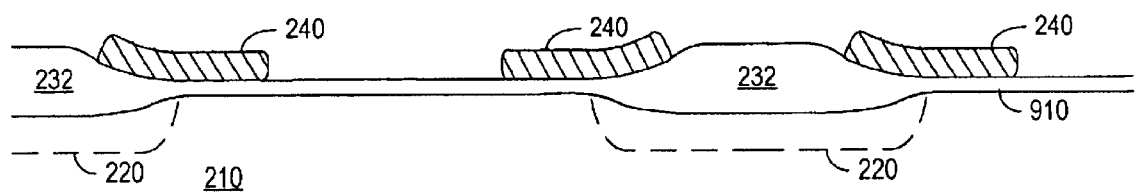
Figure 10E:
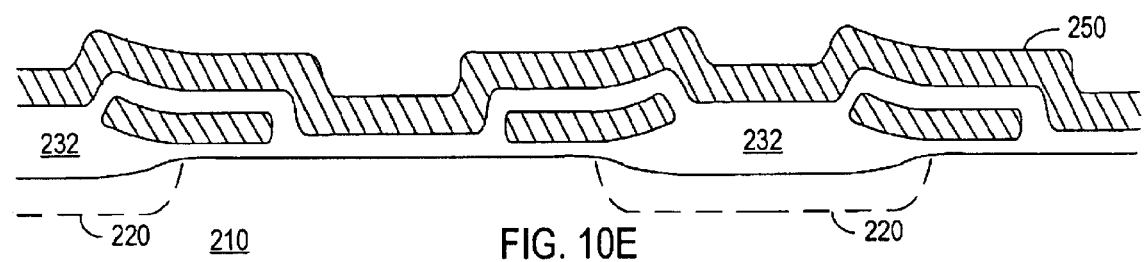

FIG. 10C illustrates an implantation process using floating gates 240 and mask layer 1040 to control areas 1020 of substrate 210 implanted. Mask 1040 protects areas of substrate corresponding to the central channel regions of the memory transistors being formed, and floating gates 240 defined the edges of implanted areas 1020 corresponding to source/drain regions 220 and diffused lines 620. An oxidation process can then form mini oxide isolation regions 232. The oxidation process preferentially oxidizes implanted areas 1020 and expands implanted areas 1020 through lateral diffusion that heating causes. If necessary, a protective mask such as a silicon nitride mask (not show) can protect floating gates 240 and the central channels of the memory transistors from the oxidation process. Implantation steps can adjust the threshold voltage of the central channel region CC relative to end channel regions CA and CB. FIG. 10E shows the final structure which is formed from the structure of FIG. 10D by deposition of an inter-poly insulating layer such as an ONO layer and deposition and patterning of a second polysilicon layer to form word line 650.

As noted herein, embodiments of the invention can achieve several advantages over current non-volatile memory designs. In particular, when compared to memory cells using charge trapped in insulators, memory transistors in accordance with the present invention store orders of magnitude more charge, which facilitates more precise control of threshold voltages for storage of analog or multi-bit values. When compared to conventional, floating gate transistors, embodiments of the invention permit use of a wider range of threshold voltages for data storage because central regions in the twin-floating gate transistors provide a sure shut off of unselected memory cells, which allows the floating gate to be erased to depletion (storing holes) which in turn provides a larger threshold voltage range for analog or multi-bit storage. Additionally, arrays of twin-floating gate transistors require fewer metal and diffused bit/virtual ground lines than do similar arrays of conventional floating gate transistors and thus reduce capacitive couplings that can introduce noise and slow memory operation, and to provide a wider pitch for the layout of array supporting circuits such as column decoders and drivers.

Although the invention has been described with reference to particular embodiments, the description provides examples of the invention's application and should not be taken as a limitation. In particular, although specific memory transistors, array architectures, and access operations are described, each may be used separately from the others. The described memory transistor structures, for example, can be employed in other array structures or with alternative erase, write, or read operations. The array structure applied herein to the dual-floating gate memory transistors can also be applied to other memory transistor structures including, for example, the 2-bit memory cells of FIG. 1. Various other adaptations and combinations of features of the embodiments disclosed are within the scope of the invention as defined by the following claims.

What is claimed is:

1. A write operation for a memory transistor including a substrate having a first source/drain region, a second source/drain region, and a channel extending between the first and second source/drain region, a first floating gate overlying and insulated from a first end regions of the channel, a second floating gate overlying and insulated from a second end regions of the channel, and a control gate overlying and insulated from the first and second floating gates and a central portion of the channel, the write operation comprising:

biasing the control gate at a first voltage;

grounding the first source/drain region; and biasing the second source/drain region at a second voltage, wherein the first and second voltages respectively on the control gate and the second source/drain region induce channel hot electron injection that injects electrons into the second floating gate without changing the charge on the first floating gate.

2. The write operation of claim 1, further comprising:

biasing the control gate at the first voltage;

grounding the second source/drain region; and biasing the first source/drain region at the second voltage, wherein the first and second voltages respectively on the control gate and the first source/drain region induce channel hot electron injection that injects electrons into the first floating gate without changing the charge on the second floating gate.

3. The write operation of claim 1, further comprising stopping the write operation when the second floating gate reaches a charge state representing an analog or a multi-bit value.

4. The write operation of claim 3, further comprising:

biasing the control gate at a third voltage;

grounding the second source/drain region;

biasing the first source/drain region at a fourth voltage; and comparing current through the memory transistor to a reference current associated with the multi-bit value, wherein stopping the write operation is in response to the comparing indicating that the current through the memory transistor corresponds to a level associated with the multi-bit value.

5. The write operation of claim 4, wherein:

biasing the control gate, the first source/drain region, and the second source/drain region respectively at the first voltage, ground, and the second voltage occurs during a sequence of programming cycles; and biasing the control gate, the first source/drain region, and the second source/drain region respectively at the third voltage, the fourth voltage, and ground occurs during a sequence of verify cycles.

6. The write operation of claim 1, wherein the charge state of second floating gate is such that charge carrier inversion occurs in the second end region of the channel when the control gate is grounded.

7. A read operation for a memory transistor including a substrate having a first source/drain region, a second source/drain region, and a channel extending between the first and second source/drain region, a first floating gate overlying and insulated from a first end region of the channel, a second floating gate overlying and insulated from a second end region of the channel, and a control gate overlying and insulated from the first and second floating gates and a central portion of the channel, the read operation comprising:

biasing the control gate at a first voltage;

grounding the first source/drain region;

biasing the second source/drain region at a second voltage;

comparing a channel current of the memory transistor to one or more reference currents associated with stored values; and using results of the comparing to determine a first stored value that is associated with the first floating gate.

8. The method of claim 7, wherein the one or more reference currents comprise a plurality of reference currents respectively corresponding to multi-bit stored values.

9. The method of claim 7, further comprising:

biasing the control gate at the first voltage;

grounding the second source/drain region;

biasing the first source/drain region at the second voltage;

comparing the channel current of the memory transistor to the reference currents associated with the multi-bit values; and using results of the comparing to determine a second stored value that is associated with the second floating gate.

10. The method of claim 7, wherein the one or more reference currents comprise a plurality of reference currents respectively corresponding to multi-bit stored values.

* * * * *